United States Patent [19]

Cohen

[11] Patent Number: 4,921,103

[45] Date of Patent: May 1, 1990

[54] VENTILATED RACK CASE

[75] Inventor: Wayne E. Cohen, Emerson, N.J.

[73] Assignee: Latin Percussion, Inc., Garfield, N.J.

[21] Appl. No.: 392,067

[22] Filed: Aug. 10, 1989

[51] Int. Cl.$^5$ .......................... A45F 3/04; B65D 81/02
[52] U.S. Cl. ...................................... 206/523; 206/810; 206/334; 224/209; 224/261
[58] Field of Search ................ 206/521, 523, 328–334; 224/209, 210, 261, 153

[56] References Cited

U.S. PATENT DOCUMENTS

| | | | |
|---|---|---|---|
| 2,792,980 | 5/1957 | Brown | 224/209 |
| 2,823,971 | 2/1958 | Hoyt | 224/209 X |
| 3,482,895 | 12/1969 | Becklin | 206/334 X |
| 4,561,576 | 12/1985 | Lowe et al. | 224/209 |

FOREIGN PATENT DOCUMENTS

| | | | |
|---|---|---|---|
| 1052572 | 9/1953 | France | 224/209 |
| 56695 | 5/1977 | Japan | 206/328 |

Primary Examiner—William Price
Attorney, Agent, or Firm—Brumbaugh, Graves, Donohue & Raymond

[57] ABSTRACT

A ventilated rack case for alternatively transporting and operating a rack mountable unit of electronic equipment includes an inner rectangular frame, which is open at the front and back, shock absorbing material, e.g. foam, surrounding the frame, and an outer cover over the foam. For ventilation, cutouts are provided in the foam and frame and a protective screen is secured in the openings. The cover includes front and back flaps for selectively closing the front and back openings of the frame. A top ventilation flap is configured to cooperate with the cutouts to provide ventilation. The flaps can be closed for storing and transporting the rack, and opened for use to allow access to the control panels and proper ventilation of the electronic equipment without removal from the case.

9 Claims, 1 Drawing Sheet

4,921,103

VENTILATED RACK CASE

BACKGROUND OF THE INVENTION

The present invention is a case for rack mountable electronic units, permitting the unit to be enclosed for transportation and, alternatively, exposed for operation without removal from the case.

Certain electronic equipment, such as amplifiers, other types of electronic sound equipment used with musical instruments, and other electronic devices, are contained in rectangular metal housings and adapted for mounting in electronic equipment racks. Electronic units of this type come in various standard sizes, established by the Electronics Industry Association. Because the housings contain electronic components, wiring, and other devices, care must be taken when storing or transporting racks to protect the equipment from damage.

There is presently on the market a backpack type storage bag for storing and transporting racks. The backpack has a plywood inner frame and a foam lined bag around the frame. A pair of steel rails are attached to the plywood, on opposite sides of the frame interior, which are designed to engage standard mounting hardware on the housing of the electronic unit, so that the unit may be secured within the frame. The front and back panels of the bag unzip to allow access to the front and rear panels of the unit, which normally contain front controls and rear electronic plug and power cord connections, respectively. A backstrap and a handle are provided for carrying the bag.

SUMMARY OF THE INVENTION

The present invention is an improved ventilated case for transportation and operation of a rack mountable electronic unit of the type having a rectangular housing and pair of laterally disposed fastening devices. More particularly, in one embodiment a case according to the invention comprises an inside frame, which is open at the front and back and is sized to receive a standard unit, a shock absorbing material, e.g. foam, disposed about the frame, and preferably a cover disposed about the shock absorbing material. A pair of laterally opposed mountings are secured to the inside of the frame to align with the standard fastening devices of an electronic unit.

The frame also has a cutout permitting ventilation of an electronic unit by the passage of air through the frame. A structural grid is fastened to the frame covering the cutout so as to permit ventilation while also providing physical protection of an enclosed unit.

The cover includes front and back flaps with VELCRO or other fastening means for alternatively enclosing and exposing the front and back openings. The cover also includes a top flap, also having a closure means such as a zipper, operatively cooperating with the cutout in the frame to permit ventilation when the flap is open. Cutouts are provided in the shock absorbing material, below the top flap, to provide a ventilation passage to the interior of the frame.

A ventilated rack case according to the present invention provides a protective enclosure for electronic unit storage, and allows the unit to be readily transported. Moreover, a rack case according to the invention provides ventilation of the electronic unit, through convection cooling, which permits the unit to be used while in the case without the necessity of removal of the unit.

For a better understanding of the invention, reference is made to the following detailed description of a preferred embodiment, taken in conjunction with the drawings accompanying the application.

DETAILED DESCRIPTION OF A PREFERRED EMBODIMENT

Figure 1:
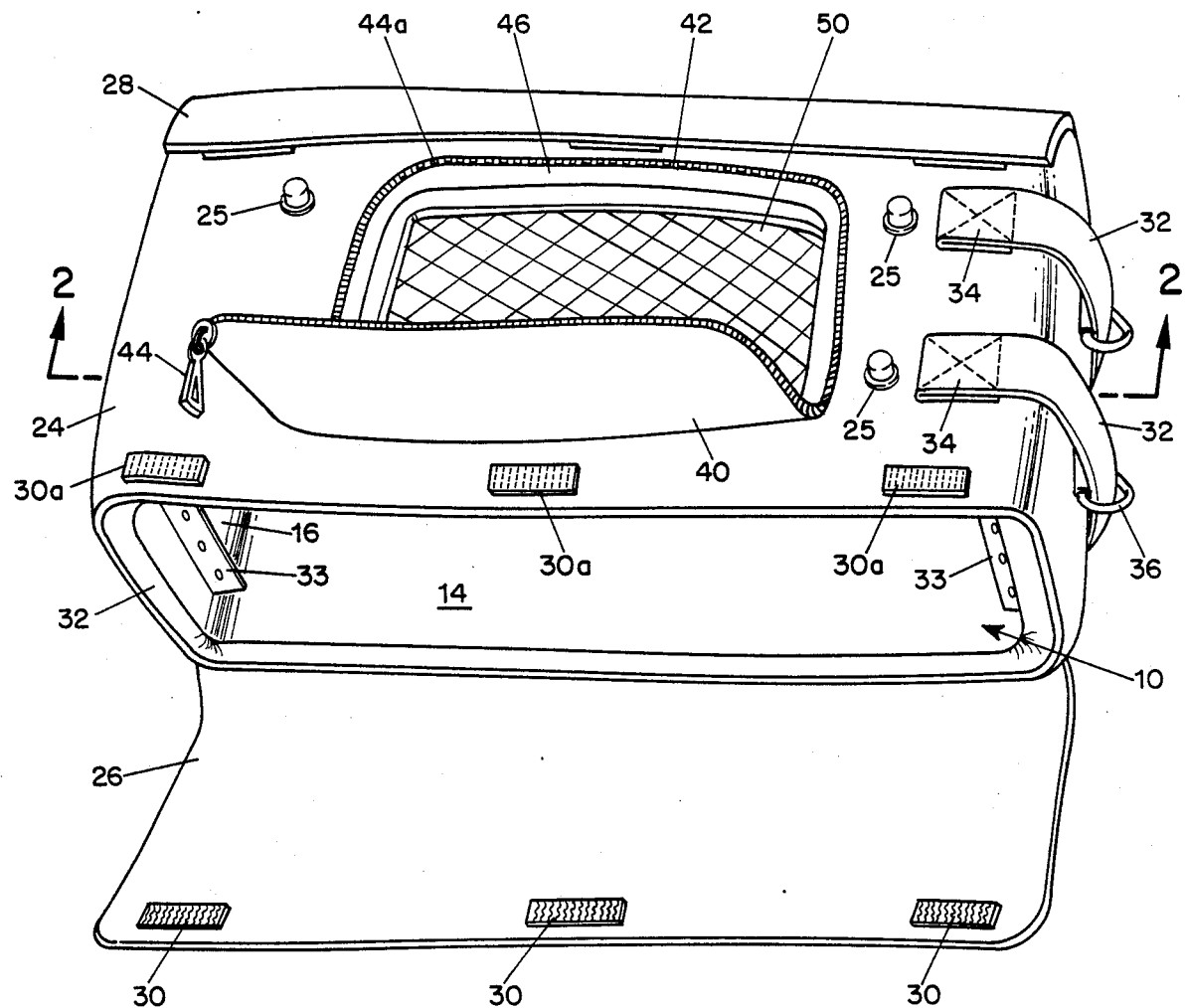
FIG. 1 is a top perspective view of a ventilated rack case according to the invention.

A ventilated rack case includes an inner frame 10 defining a rectangular shaped passage which is open at the front and back. The frame 10, which includes a top 12, bottom 14, and opposed sides 16, may be formed of plywood pieces which are glued along jointed edges.

The plywood frame 10 is surrounded by top 18, bottom 20, and side 22 portions of a shock absorbing material, such as a foam. A cover 24, made of fabric, plastic, or other suitable material, is snugly disposed around the foam 18, 20, 22, surrounding the frame 10. If desired, the shock absorbing layer may be formed by dispensing foam into the space between the cover and frame. Alternatively, preformed pieces of foam can be used, shock absorbing material may be bonded to the inside of the cover 24, or be formed as an integral unit with cover 24.

As illustrated, the top portion 12 of the frame 10 also includes a cutout 13 configured to permit ventilation of an enclosed electronic unit by air flow produced by convection, a fan enclosed in the unit, or both.

The cover 24 includes front 26 and back 28 flaps, for alternatively enclosing or exposing the front and back frame openings, that can be closed using mating pieces of VELCRO 30, or a zipper or the like. The cover 24 also includes a top flap 40 which opens to expose a ventilation opening 42 in the cover 24 which operatively cooperates with the cutout 13 in frame 10 for alternatively enclosing the cutout 13 or permitting ventilation through cutout 13. Closure means, such as a zipper 44, 44a, are provided on the flap 40 and about the opening 42, so that the opening 42 can be secured in a closed position. The cover 24 may be secured, e.g. by screws 25, directly to the frame 10.

Below the cover opening 42, cutout 46 is formed through the foam upper portion 18 in cooperative alignment with cutout 13 in frame upper piece 12. A structural grid 50, which may be a stiff steel mesh, is disposed at the frame cutout 13 and attached by screws 52 or other means to the top piece 12 of the frame 10.

As shown in FIG. 1, a fabric or plastic strip 32 may be disposed around the front opening to cover the foam material 18, 20, 22, and a similar strip (not shown) may be disposed around the back opening. Preferably, a pair of brackets 35 or other support devices are screwed to opposite sides 16 of the frame 10, and positioned for supporting the conventional mounting rails of a rack.

Figure 2:
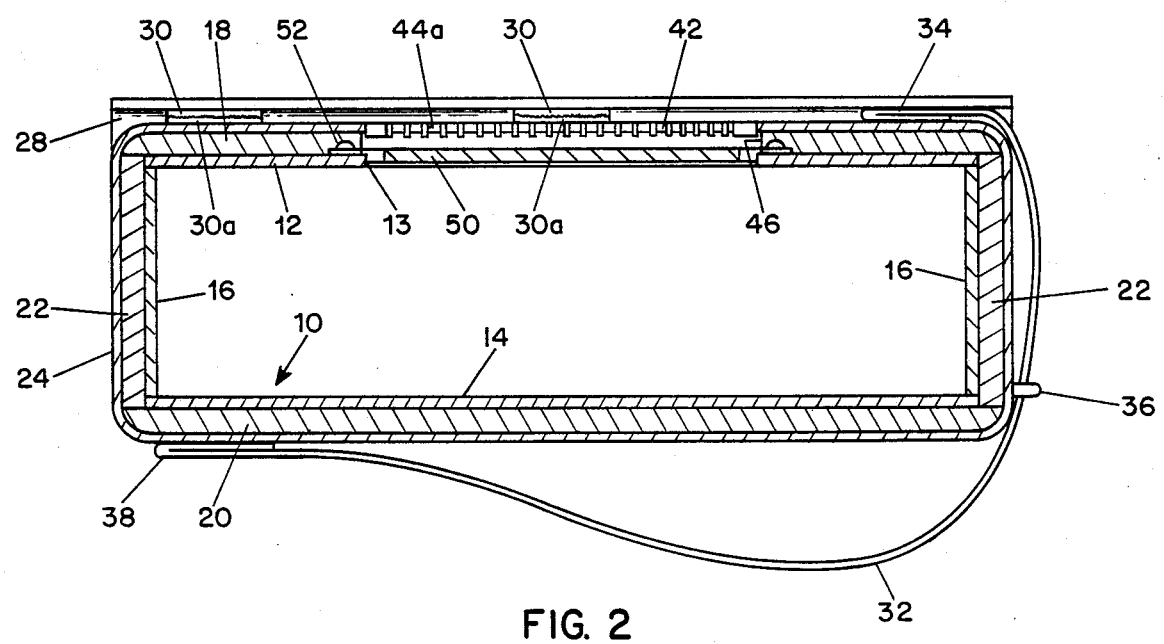
FIG. 2 is a sectional view of a case, taken through lines 2—2 of FIG. 1.

Preferably, one or more straps or handles are provided for carrying the case. In the example shown in FIGS. 1-2, a pair of shoulder straps 32 are secured to the cover 24. One end 34 of each strap 32 is sewn to the top of the cover 24. The straps 32 wrap around one of the sides, through a guide 36, and are secured at the far end as shown at 38, of the bottom part of the cover. Preferably also, a handle (not shown) is attached to the side of the case for carrying. The foregoing is merely exemplary and other arrangements of carrying means, which will be apparent to persons skilled in the art, may be employed.

With the front flap 26 open as in FIG. 1, an amplifier or other piece of electronic equipment can be fitted into the frame 10, and thereafter fastened to the mounting brackets 33. For storing and transporting the equipment, flaps 26, 28 and 40 are closed, enclosing and protecting the electronic unit. When the equipment is to be used, the front and rear flaps 26 and 28 are pulled open, to permit access to the front controls and rear electronic plug and power cord connections, and the ventilation panel 40 is opened. The top opening allows air to circulate by natural convection, with hotter air rising through the opening and cooler air being drawn into the rack unit through the back and front of the bag. In other embodiments openings through the frame, shock absorbing material and cover may be provided in the bottom and sides to permit air flow in operative cooperation with air flow openings in the housing of particular forms of electronic units. Thus, the invention provides normal ventilation of, and heat dissipation from, the electronic components.

The foregoing represents a preferred embodiment of the invention. Variations and modifications of the example shown and described will be apparent to persons skilled in the art, without departing from the inventive principles disclosed. For example, the case frame may be made of materials other than plywood, such as plastic or fiber board, or the case frame may be formed of a sturdy shock absorbing material to eliminate the need for a separate shock absorbing layer. In addition, it is possible to build the case without an outside cover, or with a cover of different materials, and a structural grid member to protect a cutout may be attached to or made part of a cover flap at a cutout. In the latter case the grid would provide protection of an electronic unit when the flap was closed, but would open with the flap to provide access to the unit. All such variations and modifications are intended to be within the he scope of the invention as defined in the following claims.

I claim:

1. A ventilated rack case for transportation and operation of a rack mountable electronic unit of the type having a rectangular housing, a front control panel, a rear connector panel and fastening means for rack mounting, said case comprising:

an inner frame having a top portion, bottom portion and opposed side portions arranged in a generally rectangular shape open at the front and back, and means for cooperating with fastening means on an electronic unit, said frame having cutout means for permitting ventilation of an electronic unit while also providing physical protection of such a unit;

cover means for surrounding said frame and having front and back flaps for enclosing and exposing the front and back openings, respectively, a flap operatively cooperating with said cutout means for enclosing and permitting ventilation through said cutout means, and means for securing said flaps in a closed position;

whereby an electronic unit may be fastened in said case and alternatively transported with flaps closed for protection, or placed in operation with the flaps open for front and rear access and ventilation through the cooperative functioning of the cutout means and associated flap.

2. A ventilated rack case as defined in claim 1, additionally comprising a structural grid, arranged to cooperate with said cutout means, for providing physical protection of an electronic unit.

3. A ventilated rack case as defined in claim 2, wherein said grid is secured to said frame so as to cover said cutout means.

4. A ventilated rack case as defined in claim 2, additionally comprising shock absorbing material, disposed between the outer surface of said frame and the outer surface of said cover means, for providing additional protection to an electronic unit.

5. A ventilated rack case as defined in claim 4, wherein said shock absorbing material comprises sections of foam material surrounding the frame and said cover means comprises an outside surface of flexible fabric.

6. A ventilated rack case as defined in claim 5, additionally comprising straps fastened to said case for carrying the case.

7. A ventilated rack case as defined in claim 5, additionally comprising straps fastened to the cover means for carrying the case and wherein the means for securing include a zipper for closing said flaps cooperating with the cutout means.

8. A ventilated rack case in which a rack mountable electronic unit may be secured for transport and made accessible for operation without removal from said case, said case comprising:

an inner structural frame open at the front and back and having means for securing an electronic unit within the frame, said frame having at least one cutout for permitting ventilation of such a unit;

structural grid means fastened to said frame at said cutout for permitting ventilation while providing protection of an electronic unit; and cover means for enclosing said frame and grid having an outer fabric with moveable portions providing access to the front, back and cutout of said frame;

whereby said moveable portion providing access to said cutout is operatively cooperative with said cutout and grid permitting ventilation of an electronic unit which can be placed into operation without removal from said case.

9. A ventilated rack case as defined in claim 8, additionally comprising fastening means for securing said moveable portions, straps for carrying the case and shock absorbing material for cushioning the case, all of which are fastened to said cover means.

* * * * *